US007482894B2

(12) United States Patent
Wu et al.

(10) Patent No.: US 7,482,894 B2
(45) Date of Patent: Jan. 27, 2009

(54) RADIAL POWER DIVIDER/COMBINER USING WAVEGUIDE IMPEDANCE TRANSFORMERS

(75) Inventors: You-Sun Wu, Princeton Junction, NJ (US); Mark Francis Smith, Franklinville, NJ (US); James Norman Remer, Cherry Hill, NJ (US)

(73) Assignee: L-3 Communications Corporation, New York, NY (US)

( * ) Notice: Subject to any disclaimer, the term of this patent is extended or adjusted under 35 U.S.C. 154(b) by 190 days.

(21) Appl. No.: 11/601,885

(22) Filed: Nov. 20, 2006

(65) Prior Publication Data

US 2007/0063791 A1 Mar. 22, 2007

Related U.S. Application Data

(63) Continuation-in-part of application No. 11/509,160, filed on Aug. 24, 2006, now Pat. No. 7,312,673, which is a continuation of application No. 11/241,002, filed on Sep. 30, 2005, now Pat. No. 7,113,056, which is a continuation of application No. 10/773,947, filed on Feb. 6, 2004, now Pat. No. 6,982,613.

(51) Int. Cl.
*H01P 5/12* (2006.01)
*H03F 3/60* (2006.01)

(52) U.S. Cl. ........................ 333/137; 333/125; 333/127; 333/136; 333/34; 330/56; 330/124 R; 330/286; 330/295

(58) Field of Classification Search ................... 333/33, 333/34, 100, 125, 127, 128, 136, 137; 330/56, 330/66, 124 R, 286, 295
See application file for complete search history.

(56) References Cited

U.S. PATENT DOCUMENTS 3,775,694 A 11/1973 Quine ........................ 330/56

(Continued)

FOREIGN PATENT DOCUMENTS

EP 0122084 B1 10/1984
EP 0926762 A1 6/1999

OTHER PUBLICATIONS

Belohoubek, E. et al., "30-Way Radial Power Combiner for Miniature GaAs FET Power Amplifiers", *IEEE International Microwave Symposium Digest*, 1986, 515-518.

(Continued)

*Primary Examiner*—Barbara Summons
(74) *Attorney, Agent, or Firm*—Woodcock Washburn LLP

(57) ABSTRACT

A radial power divider-combiner is disclosed. Such a radial divider-combiner may include a plurality of waveguides, each of which extends between a central monopole antenna and a respective peripheral monopole antenna. Such a waveguide may have a central portion with a height-to-width ratio of two, and a peripheral portion having an aspect ratio of one. To improve impedance-matching, a transformer portion may be disposed between the central portion and the peripheral portion. Such a transformer portion may have any number of sections, from one to infinity, with each section having a respective height between that of the central portion and that of the peripheral portion. In the extreme case, where the number of "sections" is infinite, the height of the transformer portion may vary linearly from that of the central portion and that of the peripheral portion.

29 Claims, 17 Drawing Sheets

U.S. PATENT DOCUMENTS

| | | | | |
|---|---|---|---|---|
| 3,953,702 A | | 4/1976 | Bickel | 219/10.55 |
| 4,097,708 A | | 6/1978 | Bickel | 219/10.55 |
| 4,562,409 A | | 12/1985 | Saito et al. | 330/386 |
| 4,590,446 A | | 5/1986 | Hsu et al. | 333/125 |
| 4,599,584 A | | 7/1986 | Sasser et al. | 333/125 |
| 4,641,107 A | | 2/1987 | Kalokitis | 330/286 |
| 4,647,869 A | | 3/1987 | Kanelo et al. | 330/286 |
| 4,647,879 A | | 3/1987 | Vaddiparty | 333/127 |
| 4,684,874 A | | 8/1987 | Swift et al. | 333/125 |
| 4,812,782 A | | 3/1989 | Ajioka | |
| 4,901,040 A | * | 2/1990 | Ahlborn et al. | 333/26 |
| 4,926,145 A | | 5/1990 | Flam et al. | 333/125 |
| 4,933,651 A | | 6/1990 | Benahin et al. | 333/125 |
| 5,128,628 A | | 7/1992 | Marks et al. | 330/66 |
| 5,148,131 A | * | 9/1992 | Amboss et al. | 333/26 |
| 5,206,604 A | | 4/1993 | Vaninetti | 330/124 |
| 5,214,394 A | | 5/1993 | Wong | 330/286 |
| 5,256,988 A | | 10/1993 | Izadian | 330/295 |
| 5,838,201 A | | 11/1998 | Sechi | 330/286 |
| 5,920,240 A | | 7/1999 | Alexanian et al. | 333/127 |
| 6,023,612 A | | 2/2000 | Harris et al. | 455/127 |
| 6,037,840 A | | 3/2000 | Myer | 330/295 |
| 6,055,418 A | | 4/2000 | Harris et al. | 455/91 |
| 6,078,222 A | | 6/2000 | Harris et al. | 330/295 |
| 6,242,984 B1 | | 6/2001 | Stores et al. | 330/295 |
| 6,344,777 B1 | | 2/2002 | Ingram et al. | 330/295 |
| 6,420,935 B1 | | 7/2002 | Harris et al. | 330/295 |
| 6,507,243 B2 | | 1/2003 | Harris et al. | 330/129 |
| 6,982,613 B2 | | 1/2006 | Wu et al. | 333/137 |
| 7,385,462 B1 | * | 6/2008 | Epp et al. | 333/125 |

OTHER PUBLICATIONS

Hicks, C.W. et al., "Spatial Power Combining for Two-Dimensional Structures", *IEEE Transactions on Microwave Theory and Techniques*, 1998, 46(6), 784-791.

Lunden, O-P, et al., "Power Combining of Ku-band Active Dipoles in a Cylindrical Resonant Cavity", *IEEE MTT-S Digest*, 1995, 701-704.

Peterson, D.F., "Radial-Symmetric *N*-Way TEM-Line IMPATT Diode Power Combining Arrays", *IEEE Transactions on Microwave Theory and Techniques*, Feb. 1982, 30(2), 163-173.

Saleh, A.A. et al., "Planar Electrically Symmetric *n*-Way Hybrid Power Dividers/Combiners", *IEEE Transactions on Microwave Theory and Techniques*, Jun. 1980, 28(6), 555-563.

York, R.A., "Some Considerations for Optimal Efficiency and Low Noise in Large Power Combiners", *IEEE Transactions on Microwave Theory and Techniques*,2001, 49(8), 1477-1482.

Jia, P.C. et al., "Multioctave Spatial Power Combining in Oversized Coaxial Amplifier", *IEEE International Microwave Theory and Techniques*, 2002, 50(5), 1355-1360.

Ortiz, S. et al., "A 25 Watt and 50 Watt Ka-Band Quasi-Optical Amplifier", *IEEE International Symposium*, Jun. 2000, Boston, Ma., 2, 797-800.

Bialkowski, M.E. et al., "Modelling and Testing of Radial Divider/Combiners", *IEEE*, 1994, 1, 234-240, XP 010149899.

Bialkowski, M.E., "Analysis of a Planar M-Way Radial Waveguide Combiner/Divider for the Case of Arbitrary Excitation", *Conference Proceedings Article*, Aug. 1993, 1, 213-218, XP 010224190.

Chen, Y-J. et al., "A Wide-Band Multiport Planar Power-Divider Design using Matched Sectorial Components in Radial Arrangement", *IEEE Transactions on Microwave Theory and Techniques*, 1998, 46(8), 1072-1078, XP 000771938.

* cited by examiner

| Parameter | Isolation | Parameter | Isolation |
|---|---|---|---|
| S12 | -32.00 dB | S17 | -8.13 dB |
| S13 | -22.00dB | S18 | -8.73 dB |
| S14 | -9.15 dB | S19 | -21.80 dB |
| S15 | -8.00 dB | S1,10 | -27.91 dB |
| S16 | -10.18 dB | | |

FIG. 6

RADIAL POWER DIVIDER/COMBINER USING WAVEGUIDE IMPEDANCE TRANSFORMERS

CROSS-REFERENCE TO RELATED APPLICATIONS

This application is a continuation-in-part of U.S. patent application Ser. No. 11/509,160, filed Aug. 24, 2006, now U.S. Pat. No. 7,312,673, which is a continuation of U.S. patent application Ser. No. 11/241,002, filed Sep. 30, 2005, now U.S. Pat. No. 7,113,056, which is a continuation of U.S. patent application Ser. No. 10/773,947, filed Feb. 6, 2004, now U.S. Pat. No. 6,982,613. The disclosures of each of the above-referenced U.S. patent applications are incorporated herein by reference.

FIELD OF THE INVENTION

Generally, the invention relates to radial power divider/combiners. In particular, the invention relates to radial power divider/combiners that use waveguide impedance transformers and are suitable for use in solid-state power-amplifier modules.

BACKGROUND OF THE INVENTION

Solid-state power-amplifier modules (SSPAs) have a variety of uses. For example, SSPAs may be used in satellites to amplify severely attenuated ground transmissions to a level suitable for processing in the satellite. SSPAs may also be used to perform the necessary amplification for signals transmitted to other satellites in a crosslink application, or to the earth for reception by ground based receivers. SSPAs are also suitable for ground-based RF applications requiring high output power.

Typical SSPAs achieve signal output levels of more than 10 watts. Because a single amplifier chip cannot achieve this level of power without incurring excessive size and power consumption, modern SSPA designs typically use a radial splitting and combining architecture in which the signal is divided into a number of individual parts. Each individual part is then amplified by a respective amplifier. The outputs of the amplifiers are then combined into a single output that achieves the desired overall signal amplification.

Additionally, a typical power-combiner, such as the in-phase Wilkinson combiner or the 90-degree branch-line hybrid, in which a number of binary combiners are cascaded, becomes very lossy and cumbersome when the number of combined amplifiers becomes large. For example, to combine eight amplifiers using a conventional, binary microstrip branch-line hybrid at Ka-band (~26.5 GHz), the combiner microstrip trace tends to be about six inches long and its loss tends to exceed 3 dB. It should be understood that a 3-dB insertion loss means that half of the RF power output is lost. Such losses are unacceptable for most applications.

To overcome these loss and size problems, many approaches, including the stripline radial combiner, oversized coaxial waveguide combiner, and quasi-optical combiner, have been investigated. The stripline radial combiner, using multi-section impedance transformers and isolation resistors, still suffers excessive loss at Ka-band, mainly because of the extremely thin substrate (<10 mil) required at Ka-band. The coaxial waveguide approach uses oversized coaxial cable, which introduces moding problems and, consequently, is useful only at low frequencies. The quasi-optical combiner uses hard waveguide feed horns at both the input and output to split and combine the power. The field distribution of a regular feed horn is not uniform, however, with more energy concentrated near the beam center. To make field distribution uniform, these waveguide feed horns require sophisticated dielectric loading and, consequently, become very large and cumbersome.

It would be desirable, therefore, if there were available low-loss, low-cost, radial power divider/combiners that could be used in designing high-frequency (e.g., Ka-band) SSPAs.

SUMMARY OF THE INVENTION

A radial power divider/combiner according to the invention is not only low-loss, but also broadband. Because simple milling technology may be used to fabricate the divider/combiner, it can be mass produced with high precision and low cost.

Unlike conventional binary combiners that can only combine N amplifiers with $N=2^n$, a radial power combiner according to the invention can combine any arbitrary number of amplifiers. Further, the diameter of the radial combiner may be as small as 4.5 inches for Ka-band signals, which is relatively small compared with other approaches such as waveguide feed horns or the oversized coaxial waveguide approach. The radial divider/combiner of the invention can be made small in size and light in weight, which makes it suitable for the high frequency, high power, solid state power amplifiers (SSPAs) used in many space and military applications.

If desired to meet specific system requirements, the divider or the combiner may be used separately, that is, it is not necessary to use them as a pair. For example, it is possible to use a stripline divider to drive the amplifier stage of an SSPA and use the low-loss radial combiner of the invention to bring the amplified signals together into a single high-power output.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, it being understood, however, that the invention is not limited to the specific apparatus and methods disclosed.

FIG. 6 provides a table of isolation measurements from a first port to each adjacent port in an example embodiment of a radial combiner according to the invention.

DETAILED DESCRIPTION OF ILLUSTRATIVE EMBODIMENTS

Figure 1:
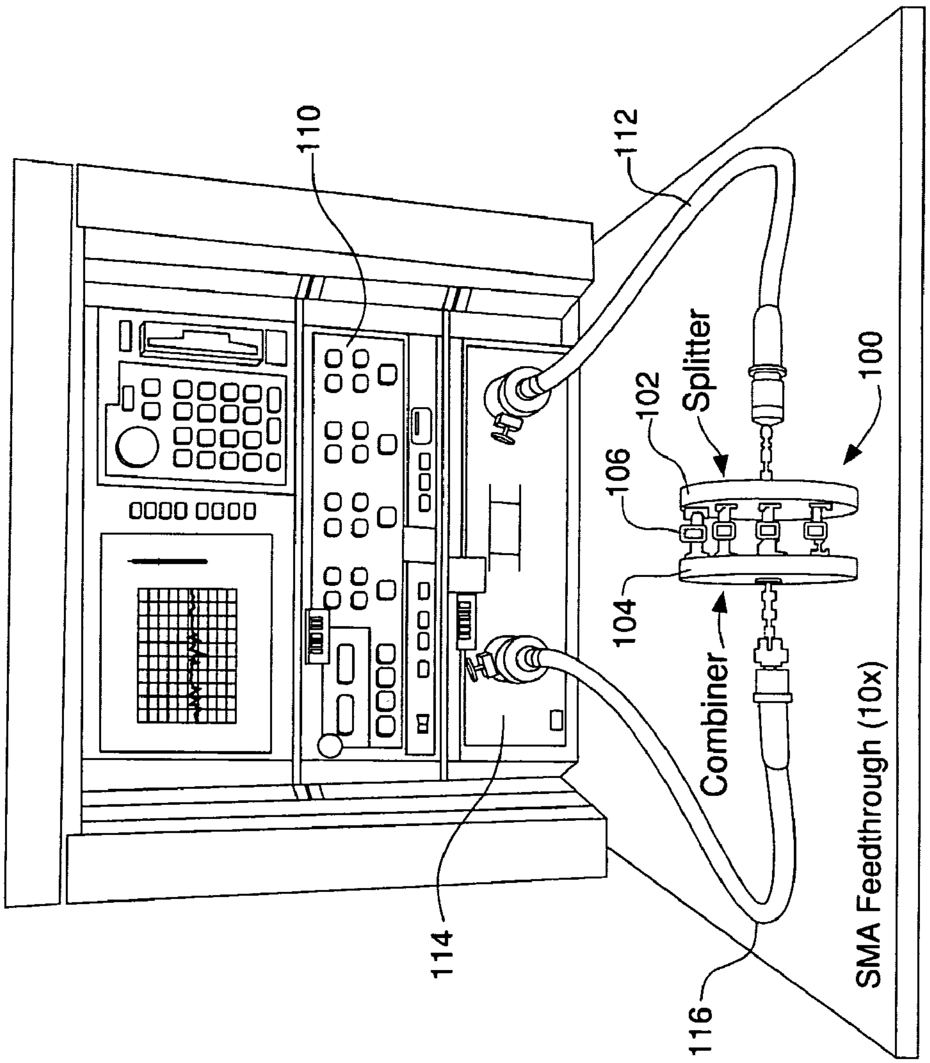
FIG. 1 depicts an example embodiment of a radial divider-combiner according to the invention.

FIG. 1 depicts an example embodiment of a radial divider-combiner 100 according to the invention. As shown, the radial divider-combiner 100 includes a divider 102 and a combiner 104. A signal generator 110 provides to the divider 102 an input signal having an amplitude and frequency. The input signal may or may not be modulated. As shown, the signal generator 110 may be a test device or simulator, for example, that provides the input signal to the divider 102 via a coaxial cable 112. In operation, the signal generator 110 may be any device that provides a signal to the radial divider-combiner 100. The coaxial cable 112 may be attached to the divider 102 via a connector, such as an SMA connector, for example.

Inside the divider 102, the input signal is divided into a plurality, N, of individual signals. Each individual signal has roughly the same amplitude and frequency as the input signal. The individual signals are provided to respective amplifiers 106. The amplifiers 106, which may be solid-state PHEMT amplifiers, for example, amplify the respective individual signals by a desired amplification gain G, which may be in the range of about 20 to 100 dB, for example. Matched amplifiers are preferred in order to keep the individual signals in-phase (so that they combine constructively). Cooling hoses (not shown) may also be used to provide a cooling fluid, such as water, for example, to cool the amplifiers.

The amplified individual signals are provided to the combiner 104. Inside the combiner 104, the amplified individual signals are combined to form an output signal. Not accounting for any losses that might occur within the divider-combiner, the amplitude of the output signal would be, therefore, about N times the amplitude of the amplified input signals, and about $N \cdot G$ times the amplitude of the input signal, where G is the linear gain of the amplifier. The output signal may then be provided to a signal receiver 114. As shown, the signal receiver 114 may be a test device, such as a spectrum analyzer, for example. In operation, the signal receiver 114 may be any device that receives the output signal from the radial divider-combiner 100. The output signal may be provided to the signal receiver 114 via a coaxial cable 116. The coaxial cable 116 may be attached to the combiner 104 via a connector, such as an SMA connector, for example.

Figure 2:
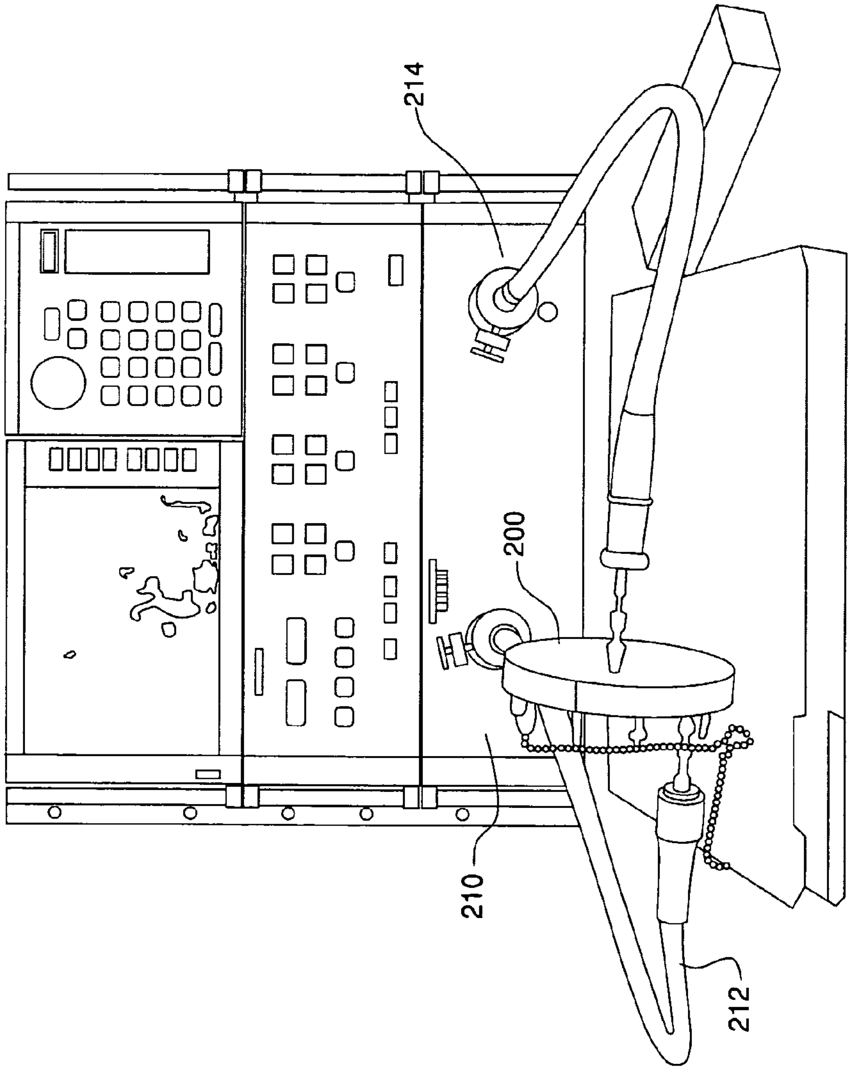
FIG. 2 depicts an example embodiment of a radial divider according to the invention.

FIG. 2 depicts an example embodiment of a radial divider/combiner according to the invention. As will be described in detail below, a divider/combiner may be set up as either a divider or a combiner depending on the direction of signal flow. As used throughout this specification, the term "divider-combiner" is meant to refer to a device that includes both a divider and a combiner, such as the device 100 shown in FIG. 1, for example. Similarly, the term "divider/combiner" is meant to refer to a device that may be used as either a divider or combiner, such as the device 200 shown in FIG. 2, for example.

As shown in FIG. 2, the divider/combiner 200 is set up as a divider. A signal generator 214 provides an input signal to the divider 200. As shown, the signal generator 214 may be a test device or simulator, for example, that provides the input signals to the divider 200 via a coaxial cable 216. The cable 216 may be attached to the divider 200 via a connector, which may be an SMA connector, for example.

Inside the divider 200, the input signals are divided to form N output signals. One or more output signals may then be provided to a signal receiver 210. As shown, the signal receiver 210 may be a test device, such as a spectrum analyzer, for example. An output signal from a selected port, for example, may be provided to the signal receiver 210 via a coaxial cable 212. The coaxial cable 212 may be attached to the divider 200 via a connector, such as an SMA connector, for example.

FIGS. 3A-3D depict details of an example embodiment of an N-way radial divider/combiner 200 according to the invention. The divider/combiner 200 will be described in connection with its functionality as a divider, though it should be understood that, by reversing signal direction, the divider/combiner may function as a combiner.

Figure 3B:
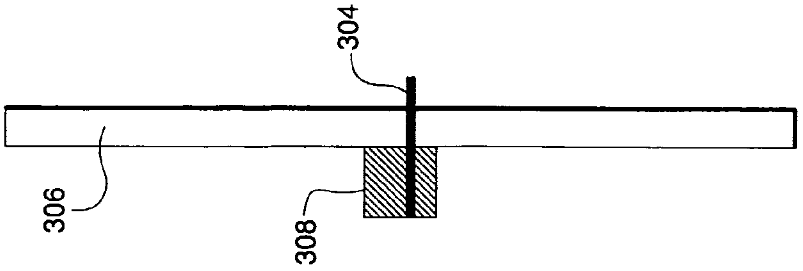
FIGS. 3A through 3D depict details of an example embodiment of a radial divider/combiner according to the invention.
Figure 3A:
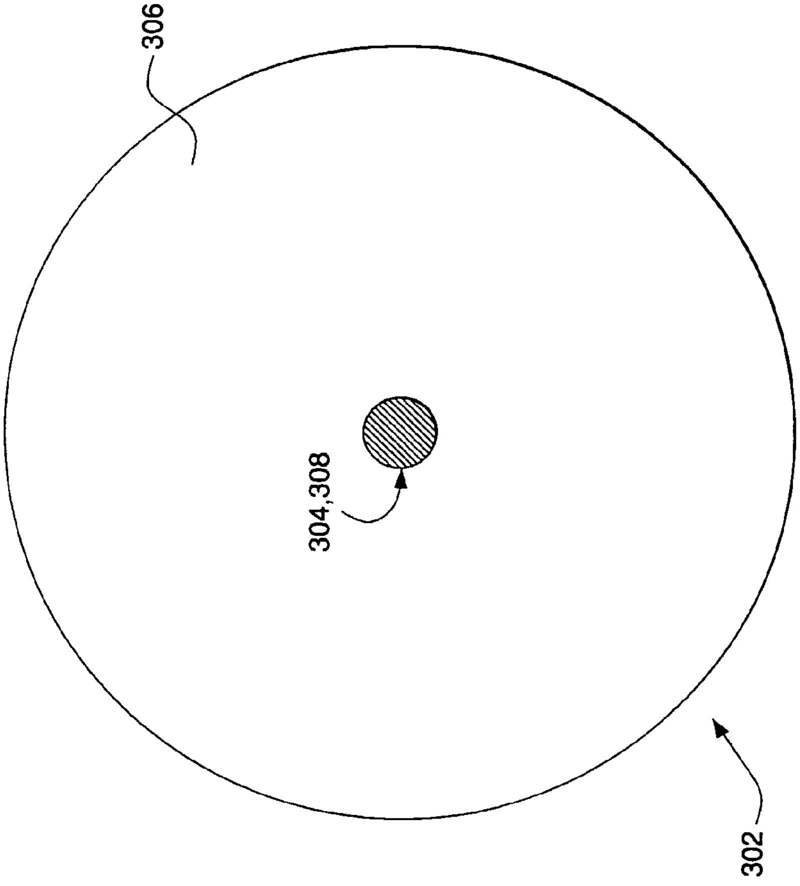

FIGS. 3A and 3B depict a cover 302 for a divider/combiner 300 according to the invention. A transmitting antenna 304, which may be a coaxial pin monopole antenna, for example, is disposed at the center of a cover plate 306. The antenna 304 extends through the cover plate 306 into an interior region of the divider 300, and may be secured to the cover plate 306 via a connector 308, which may be an SMA connector, for example. Preferably, the transmitting antenna 304 is omni-directional. That is, the transmitting antenna 304 preferably radiates the input signal uniformly over 360° in the azimuth ground plane of the divider 300. Preferably, to avoid shorting the antenna 304, the antenna 304 preferably does not extend into the interior region of the divider 300 so far that the antenna 304 contacts the base 310 (see FIGS. 3C-D) when the cover 302 and base 310 are attached to each other. The transmitting antenna 304 may be custom trimmed using a standard SMA coaxial-pin panel connector.

Figure 3D:
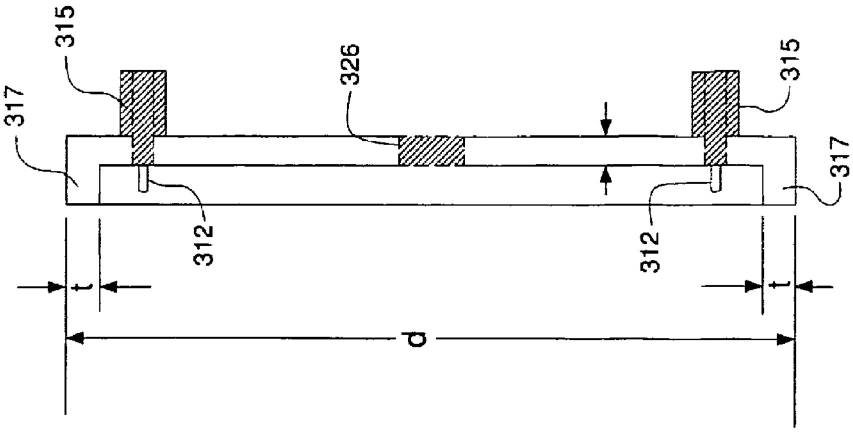
Figure 3C:
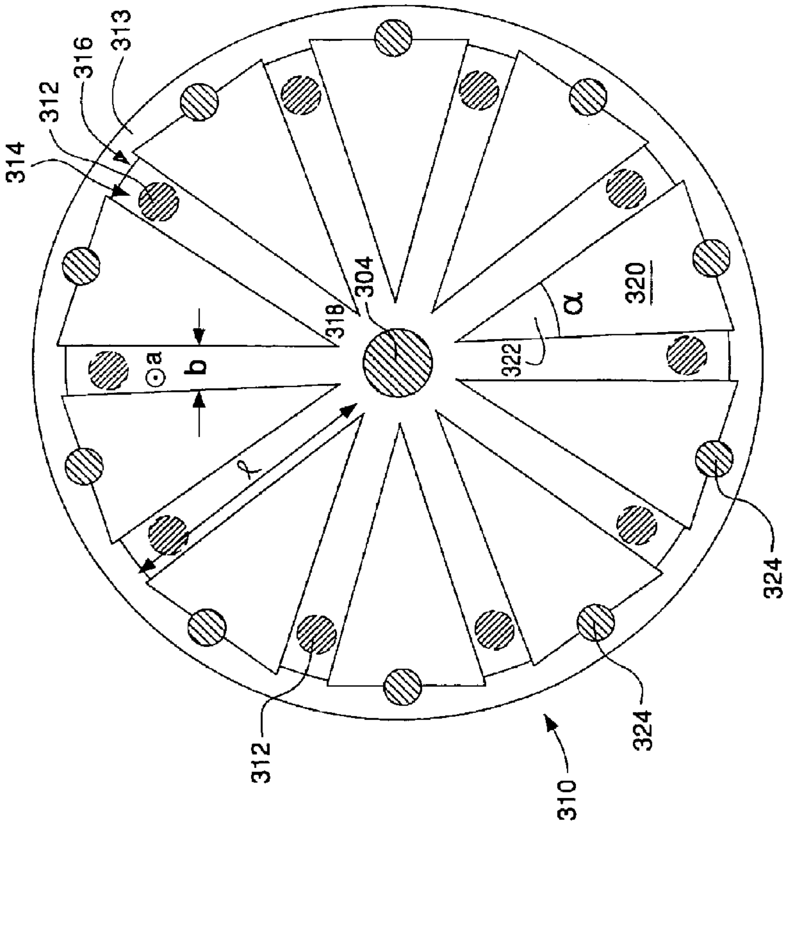

FIGS. 3C and 3D depict a base 310 for a divider/combiner 300 according to the invention. A plurality of receiving antennas 312 are disposed around the periphery of the base 310. The receiving antennas 312 extend through the base plate 313 into the interior region of the divider 300. Again, to avoid shorting the antennas 312, the antennas 312 preferably do not extend into the interior region of the divider 300 so far that the antennas 312 contact the cover 302 (see FIGS. 3A-B) when the cover 302 and base 310 are attached to each other. The receiving antennas 312 may be custom trimmed using standard SMA coaxial-pin panel connectors 315.

Though the transmitting antenna is described herein as being located on the cover and the receiving antennas are described as being located on the base, it should be understood that the transmitting antenna may be located on the base and the receiving antennas may be located on the cover. Alternatively, all of the antennas, both transmitting and receiving, may be located on either the cover or the base. Generally, it should be understood that any or all of the antennas may be located on either substrate (i.e., on either the base or the cover).

As shown, each receiving antenna 312 is disposed near a respective end 314 of a respective waveguide 316. The waveguides 316 are disposed in a radial configuration around the transmitting antenna 304 such that at least a portion of the input signal radiated by the antenna 304 enters an input end 318 of each waveguide 316.

Alternatively, receiving antennas may be placed on concentric rings located inside the outer ring of receiving antennas described above. These additional receiving antennas may be located inside the waveguides at a distance equal to $n \cdot \lambda$ from the outer ring of antennas, where n is an integer and $\lambda$ is the wavelength of the input signal.

The dimensions of the waveguides 316 are chosen to optimize propagation of the input signal along the waveguides 316, and also so that the signals received by the receiving antennas 312 may be combined constructively. Preferably, each waveguide 316 has a length, l, a width, b, and a depth, a (into the sheet of FIG. 3C). Preferably, the dimensions l, a, and b are chosen in such a way that only the single dominant $TE_{1,0}$ mode is propagating inside the waveguide. Typically, the waveguide width b is within the range $2b>\lambda>b$, where $\lambda$ is the wavelength of the input signal. Preferably, the depth, a, is chosen to be about ½ the width, b. For example, the width b, may be chosen to equal the broad dimension of a standard fundamental mode ($TE_{1,0}$) waveguide used for the desired frequency. For example, at 26.5 GHz, the desired waveguide is WR-34, with the broad dimension b=0.34 inches.

Preferably, the base 310 is monolithic. That is, the inside surface of the base 310 may be formed from a single piece of material. Any conductive, low-loss material may be used, such as aluminum, brass, copper, silver, or a metal-coated plastic, for example. The waveguides 316 may be milled away from a cylindrical piece of material, leaving a plurality of wedges 320. The wedges 320, as shown in FIG. 3C, are disposed radially about the center of the base 310, and define the waveguides 316 therebetween. To minimize reflection within the divider 300 (and, thus, to minimize loss of signal power), it is desirable that the vertexes 322 of the wedges 320 be as sharp as possible (i.e., that the vertex of angle $\alpha$ between input ends 318 of adjacent waveguides 316 not be rounded or chamfered).

The cover 302 may be secured to the base 310 via a plurality of screws or other such securing devices. For that purpose, screw holes 324 may be drilled through the base 310 at various locations. As shown in FIG. 3C, for example, screw holes 324 are disposed radially around the periphery of the base 310. Preferably, the screw holes 324 are drilled through the wedges 320 and base plate 314, as shown, so that the screws do not interfere with signal propagation through the waveguides 316.

Though a 10-way divider/combiner has been depicted for illustrative purposes, it should be understood that any number, N, of waveguides may be provided, depending on the application. It is expected that N will typically be in the range of two to 100. A ten-way power divider/combiner has been described to illustrate the point that, in contrast with conventional binary combiners, which are limited to $N=2^n$ individual signals, where n is an integer, any integer number of individual signals may be used with the radial divider/combiner of the invention.

Additionally, in a traditional radial cavity combiner that has no partition wedges, the cavity usually will resonate at $TM_{m,n}$ modes, causing sharp mismatches between the transmitting and receiving antennas. The partition wedges of the invention separate the receiving antennas from each other and thus eliminate such cavity resonances. As a result, even though the radial combiner of the invention has the outside look of a circular cavity, it shows little, if any, cavity resonances.

In an example embodiment of the invention, the base 310 may have a diameter, d, of about 4.5 inches. The walls 317 of the base may have a thickness of about ¼ inch.

A divider/combiner according to the invention may operate in a vacuum. Operation in air has been found to yield acceptable results for high-frequency applications. For low-frequency applications, where the wavelength, $\lambda$, of the input signal is long (and, therefore, the lengths of the waveguide long), it may be desirable to fill the waveguides with a dielectric material, such as a plastic, for example. Such a dielectric filling would enable smaller waveguides because the effective wavelength, $\lambda_{eff}$, of the signal propagating through the dielectric is inversely proportional to the square-root of the dielectric constant (i.e., $\lambda_{eff}=\lambda \cdot \eta^{-1/2}$, where $\lambda$ is the wavelength in vacuum and $\eta$ is the dielectric constant).

Figure 4:
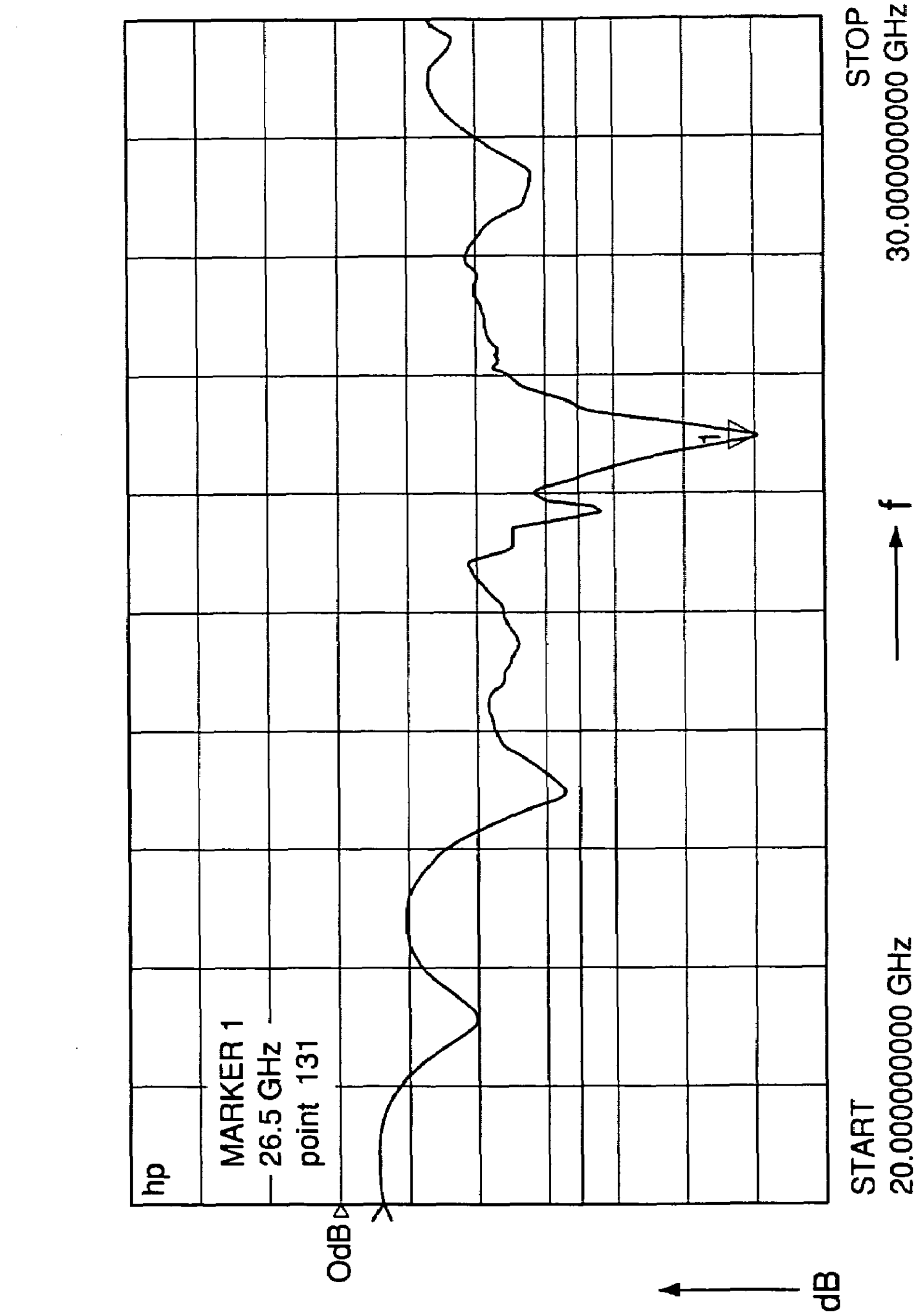
FIG. 4 provides a plot of input reflection loss for an example embodiment of a radial combiner according to the invention.

FIG. 4 provides a plot of input reflection loss for an example embodiment of a radial combiner according to the invention. Specifically, FIG. 4 shows the measured input return loss of the transmitting antenna at the center port. Input loss was measured using input signals from 20 to 30 GHz. The vertical scale is reflection loss in 5 dB per division and the 0 dB reference is the 3rd horizontal line from the top. As shown, the input return loss of the center port is better than 30 dB at 26.5 GHz.

Figure 5:
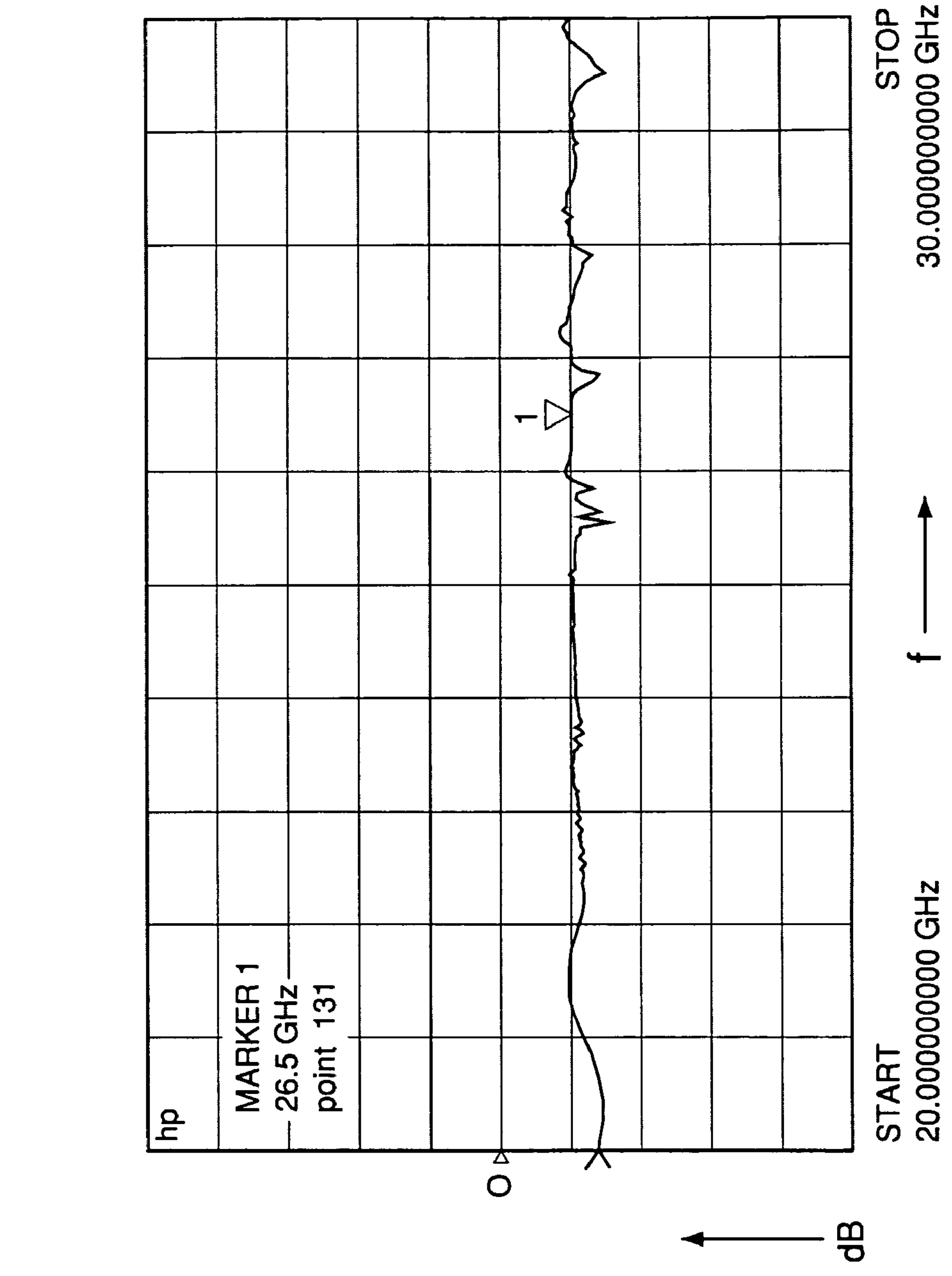
FIG. 5 provides a plot of coupling from the input port of an example embodiment of a radial divider according to the invention to a selected output port.

FIG. 5 provides a plot of coupling from the input port to a selected output port of an example embodiment of a radial divider according to the invention. To demonstrate the power dividing function, insertion loss from the transmitting center port to each of ten output ports was measured using input signals from 20 to 30 GHz. In FIG. 5, the horizontal scale is swept from 20 to 30 GHz and the vertical scale is 10 dB per division. The 0 dB reference is the 5th horizontal (center) line from the top. FIG. 5 shows that the measured insertion loss from the center port to port #9 is −10.35 dB. This result indicates that the output power of each port is about 10% (i.e., −10 dB) of the input port power. The extra 0.35 dB is due to conductor loss of the radial waveguide.

FIG. 6 provides a table of isolation measurements from a first port to each adjacent port in an example embodiment of a radial combiner according to the invention. The table provides the measured isolation of a 10-way combiner from port 1 to each adjacent port, with all unused ports terminated. As used in the table, the parameter "S1*x*" indicates a measurement from port 1 to port x. The data indicates that the combiner has good isolation (e.g., >20 dB) between immediate neighboring ports (e.g., S12 and S1,10). Between direct-facing ports, such as S15 and S16, the isolation drops to about 8 dB. Selecting designs with an odd number of ports provides better isolation to address this issue.

Figure 7:
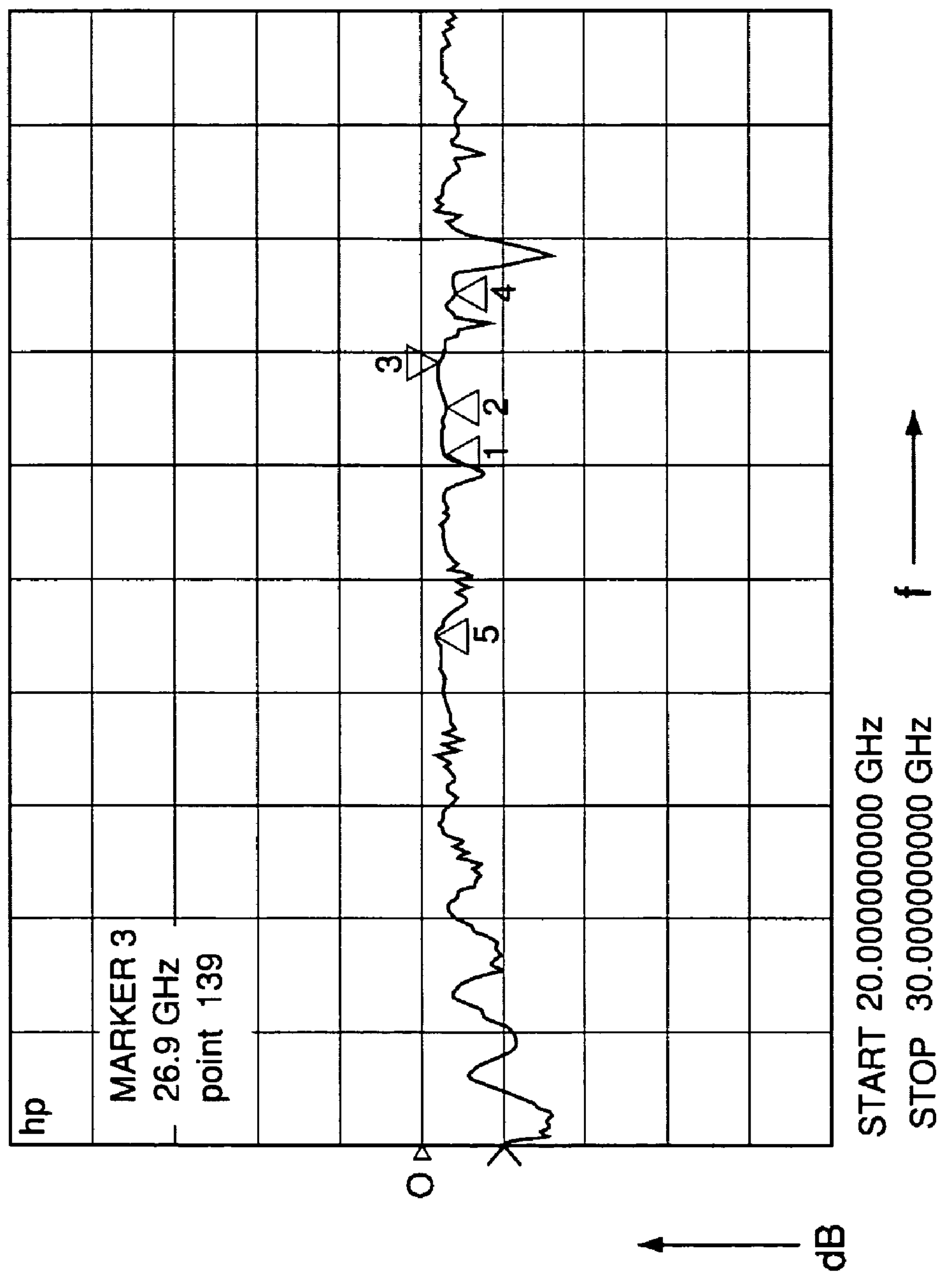
FIG. 7 provides a plot of insertion loss for an example embodiment of a radial divider-combiner according to the invention.

FIG. 7 provides a plot of insertion loss for an example embodiment of a radial divider-combiner according to the invention. To measure the net insertion loss of the power divider-combiner, two radial divider/combiners were connected back-to-back, as shown in FIG. 1, without amplifiers, using ten SMA male-to-male adapters. The overall insertion loss of the power divider-combiner was measured using input signals from 20 to 30 GHz. As shown in FIG. 7, the horizontal scale is from 20 to 30 GHz and the vertical scale is the insertion loss (S21) in 5 dB per division. The 0 dB reference is the 5th (center) line from the top. These data demonstrate a total loss of less than 2 dB (individual loss of less than 1 dB) from 23 to 27 GHz. At 26.5 GHz, the total loss was 1.41 dB. As the radial combiner loss is half of the total divider-combiner loss, the loss for the combiner alone is, therefore, 0.71 dB at 26.5 GHz. The divider-combiner insertion loss data show that the radial power divider-combiner of the invention is not only low-loss, but is also quite broad-band.

Radial Power Divider/Combiner Using Waveguide Impedance Transformers

As described in detail above, a divider/combiner according to the invention may be set up as a divider, wherein the center monopole antenna of the divider radiates an input signal isotropically in the azimuth plane. The radiated input signal may then be divided into N equal output signals.

It has been found that impedance matching is good in this signal flow direction, and that the input return loss is better than −20 dB, typically, from the center port. It has also been found that, if the signal flow direction is reversed (i.e., if the divider/combiner is set up as a combiner, and input signals are sent to the peripheral antennas), the output return loss measured from a peripheral port is typically around −13 dB. Such output return loss may cause a mismatch loss of about 5% (i.e., an insertion loss of 0.25 dB) in the signal transmission from the peripheral port to the center port.

In the embodiments described above, a waveguide extending from the periphery to the vertex may be a standard WR-34 waveguide. Near the vertex, the waveguide becomes a horn that radiates into the central radial zone with a finite mismatch of about −13 dB. This −13 dB return loss is typical for a rectangular waveguide horn with aspect ratio b/a≈2.

A waveguide horn with a square opening (i.e., aspect ratio b/a≈1) usually has much better return loss (e.g., −20 dB or lower) than a rectangular waveguide horn. A reason for this difference is that a rectangular horn with aspect ratio b/a≈2 may have an impedance (e.g., of about 200 Ω) that is not matched well to the free-space impedance (which may be about 377-Ω). On the other hand, a square horn with aspect ratio b/a≈1 may have an impedance that is better matched with the free-space impedance (e.g., of about 400 Ω).

The S22 return loss may be improved by changing the output impedance of the horn to approximate the free-space impedance. This may be made possible by reducing the aspect ratio from about 2 to about 1, i.e., by physically changing the shape of the horn openings from a rectangular horn to a square horn. To minimize the impedance mismatch between a rectangular horn and a square horn, the change of horn shape may be made possible by using an impedance transformer.

Figure 8:
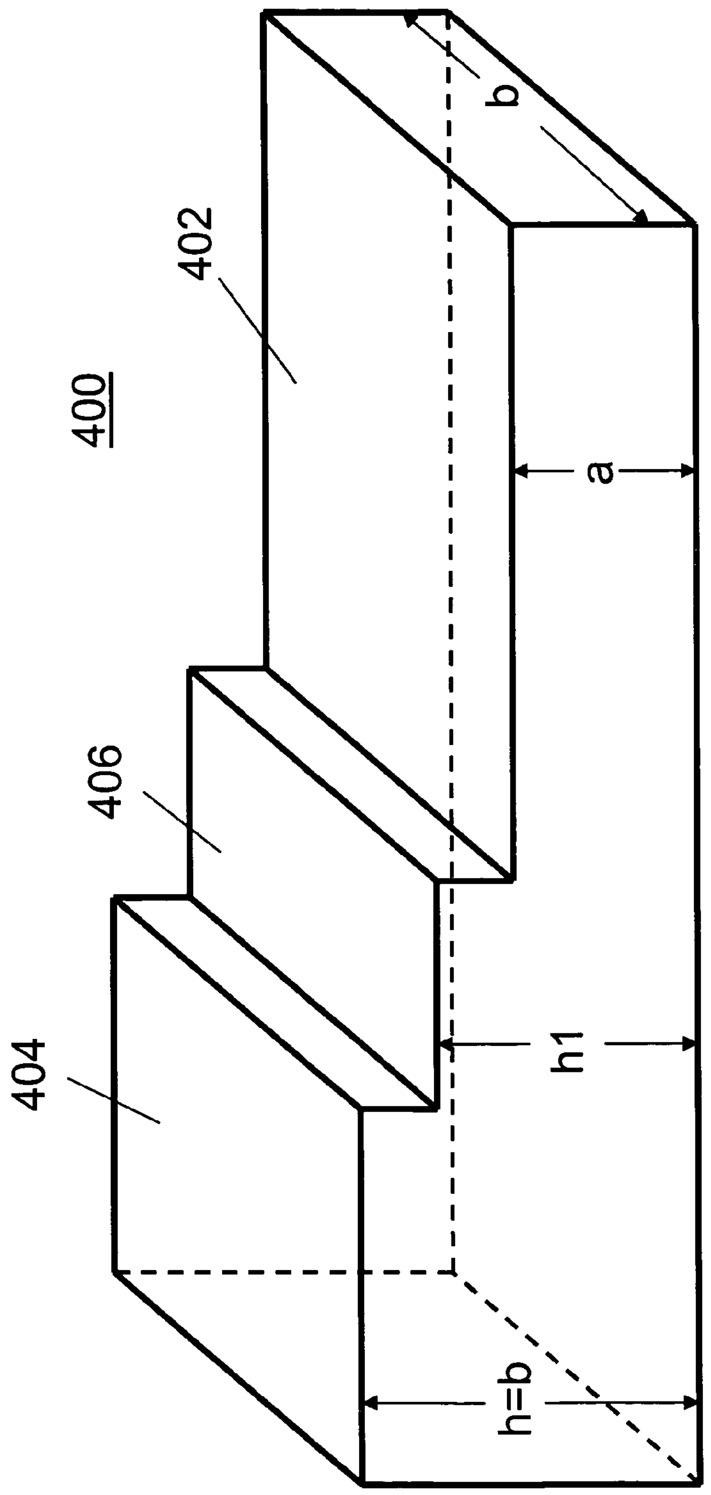
FIG. 8 depicts a waveguide channel with a 1-section transformer.

FIG. 8 depicts a waveguide channel 400 for a radial divider/combiner with a one-section, quarter-wave transformer (a "1-section transformer"). A peripheral portion 402 of the waveguide 400 may be a standard WR-34 waveguide with aspect ratio b/a≈2 (e.g., width b≈0.34 inch and height a≈b/2≈0.17"). The term "peripheral portion," as that term is used herein, refers to a portion of the waveguide that is disposed, relatively, near to the periphery of the divider/combiner. Accordingly, each such peripheral portion is also disposed, relatively, near to a respective one of the peripheral antennas.

The central portion 404 of the waveguide 400 may be a generally square waveguide, with aspect ratio b/a≈1 (e.g., a≈b≈0.34"). The term "central portion," as that term is used herein, refers to a portion of the waveguide that is disposed, relatively, near to the central radial zone of the divider/combiner. Accordingly, each such central portion is also disposed, relatively, near to the central monopole antenna.

A transformer portion 406 of the waveguide 400 may be disposed between the peripheral portion 402 and the central portion 404. As shown, the transformer portion 406 may have a height h1 (i.e., an aspect ratio of h1/a). The height h1 may be determined to provide impedance-matching that is desired for a particular application.

There are several kinds of impedance-matching transformers, each with its own unique pass-band characteristics. A Butterworth transformer, for example, tends to provide maximum flatness in the pass band. A Chebyshev transformer tends to provide equal reflection ripples in the pass band. Because the Chebyshev transformer normally achieves the maximum bandwidth with a fixed, tolerable mismatch, Chebyshev transformers will now be described in more detail.

Figure 9:
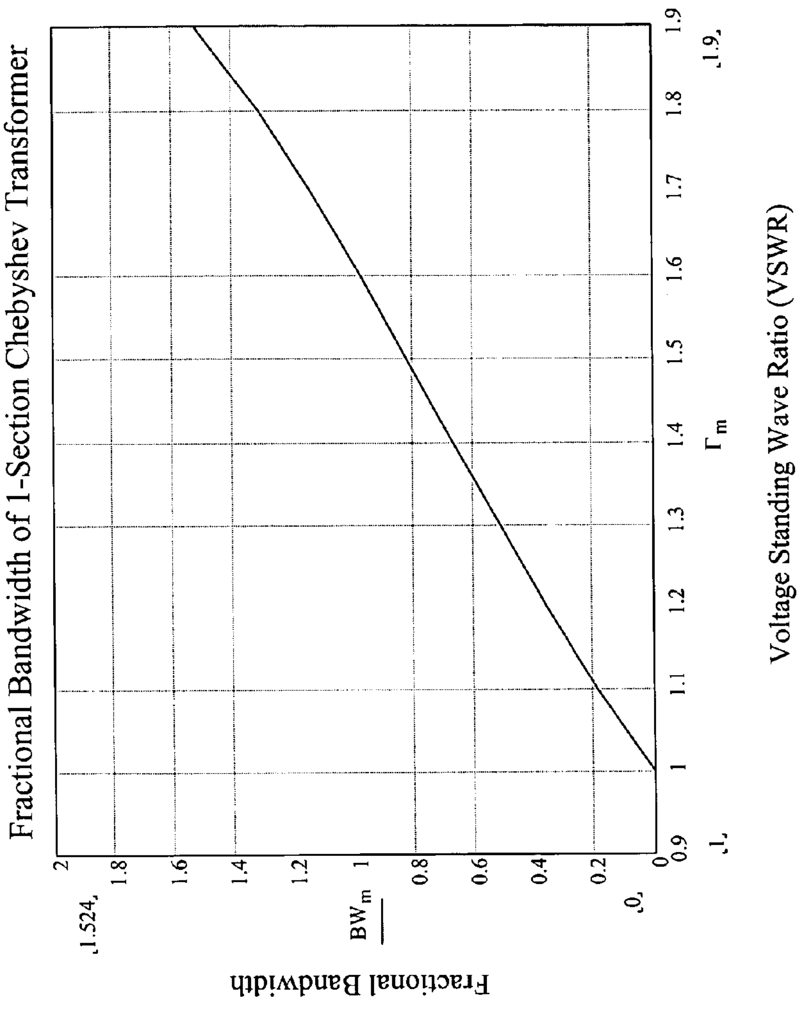
FIG. 9 provides a plot of fractional bandwidth versus voltage standing wave ratio (VSWR) for a 1-section Chebyshev transformer.

FIG. 9 provides a plot of fractional bandwidth versus voltage standing wave ratio (VSWR) for a 1-section Chebyshev transformer, assuming a fixed impedance ratio of 2-to-1. For a −20 dB return loss, that corresponds to a reflection coefficient ρ=0.1 and a VSWR=1.22. As shown in FIG. 9, the fractional bandwidth for VSWR=1.22 in the 1-section Chebyshev transformer is 0.388 or about 39%.

Figure 10:
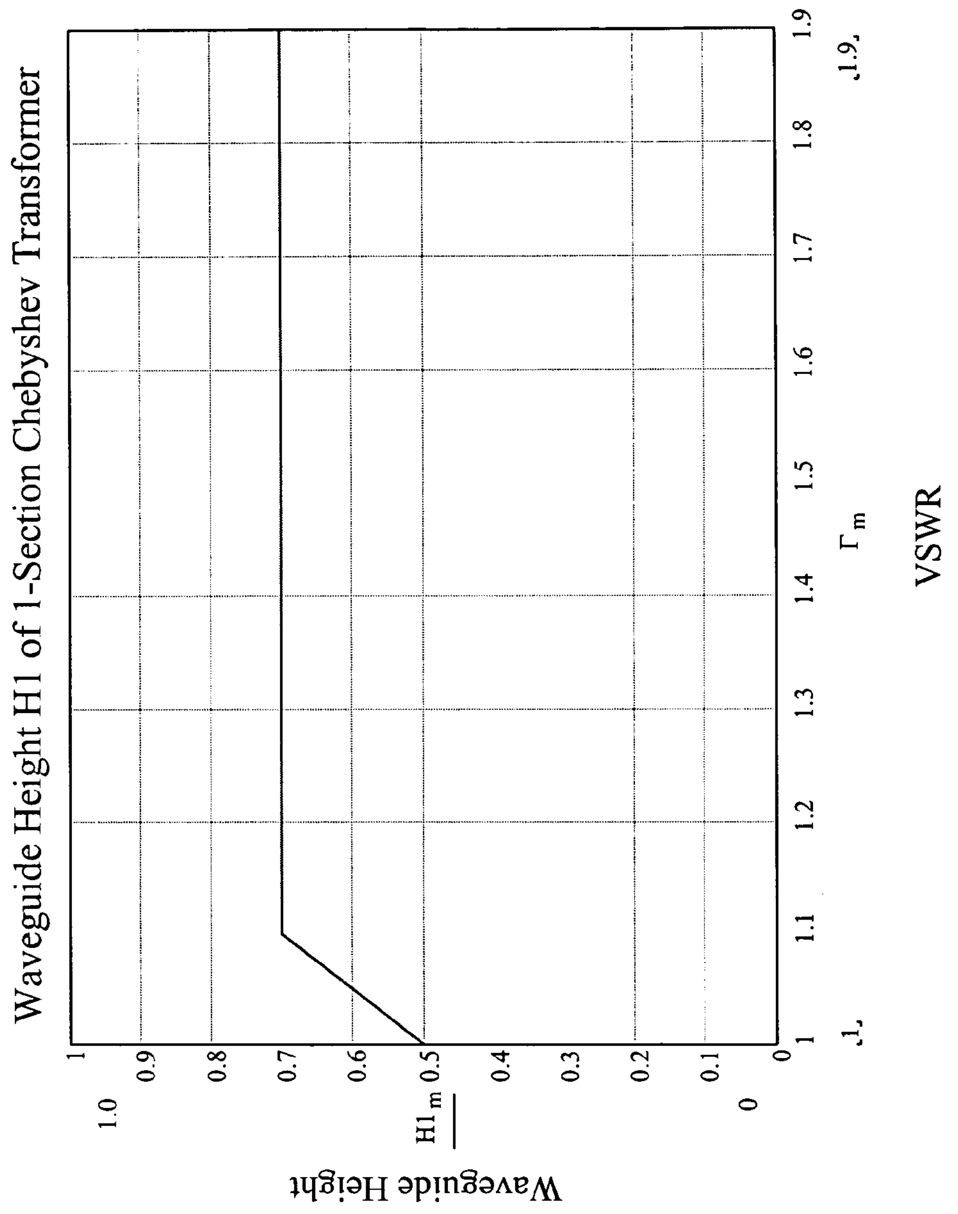
FIG. 10 provides a plot of waveguide height versus VSWR for a 1-section Chebyshev transformer.

FIG. 10 provides a plot of calculated transformer waveguide height (normalized to the full height b) versus VSWR for a 1-section Chebyshev transformer. For VSWR=1.22, the transformer height h1 may be about 0.7*b. As the VSWR is reduced to 1, the fractional bandwidth shown in FIG. 9 is decreased to 0, and the transformer height converges to that of a Butterworth transformer, i.e., with height h1=SQRT(b*a)≈SQRT((b^2)/2)≈0.707*b. The transformer portion 406 may have a length that may be one-quarter of the guided wavelength, i.e., L1=Lg/4, where the guided wavelength is defined by Lg=L0/SQRT(1−(L0/b)^2), and L0=C/F=free-space wavelength. Thus, h1 may be about 70% of the waveguide width.

Figure 11:
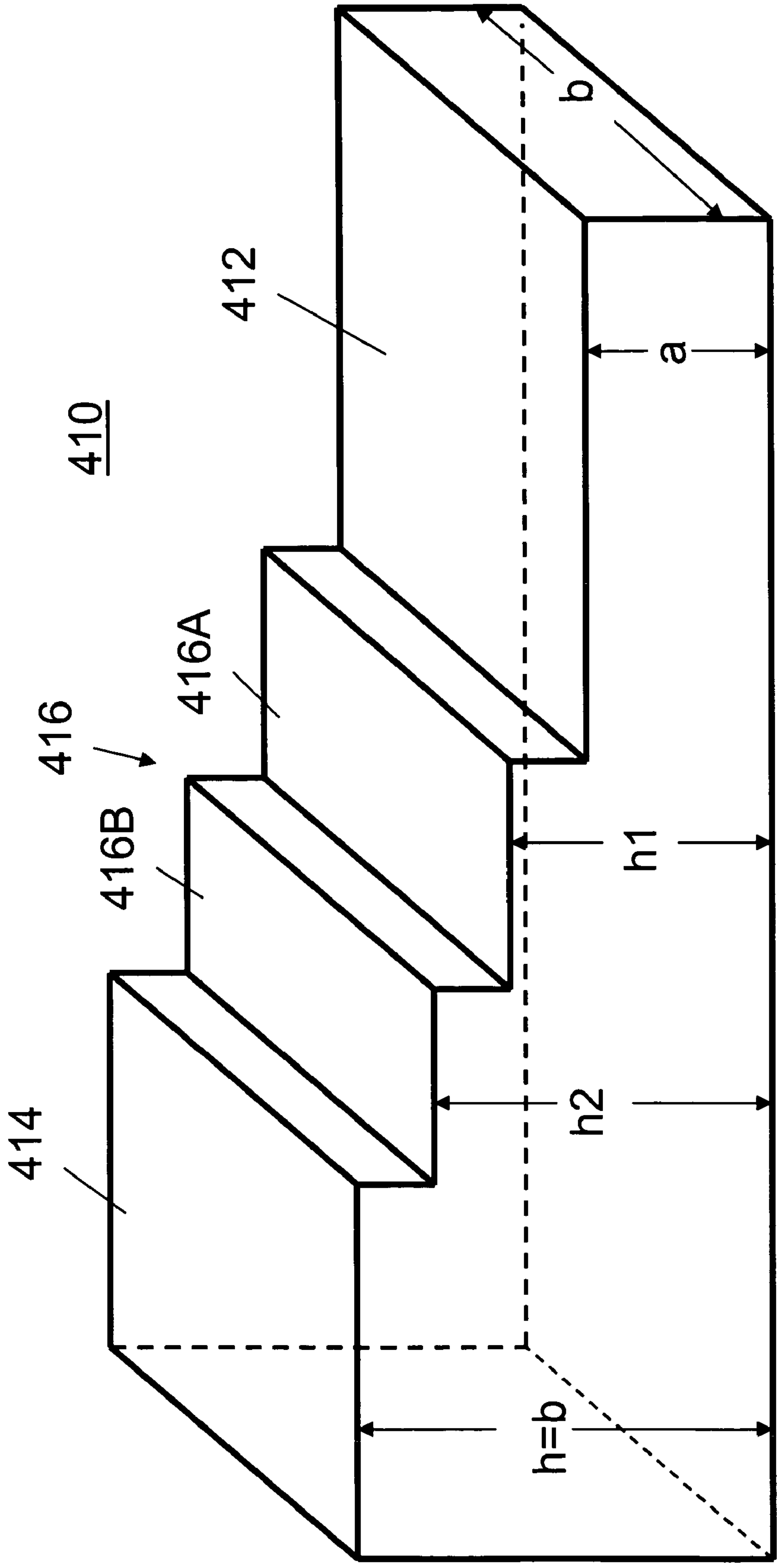
FIG. 11 depicts a waveguide channel with a 2-section transformer.

FIG. 11 depicts a waveguide channel 410 for a radial divider/combiner with a 2-section, Chebyshev, impedance transformer. As shown, a peripheral portion 412 of waveguide 410 may be a standard WR-34 waveguide with aspect ratio b/a≈2 (e.g., width b≈0.34 inch and height a≈b/2≈0.17"). A central portion 414 of the waveguide 410 may be a generally square waveguide, with aspect ratio b/a≈1 (e.g., a≈b≈0.34"). A transformer portion 416 of the waveguide may be disposed between the peripheral portion 412 and the central portion 414.

As shown, the transformer portion 416 may have two sections, 416A and 416B, with heights h1 and h2, respectively. The sections 416A, 416B may have the same length, L, which may be one quarter of the guided wavelength.

Figure 12:
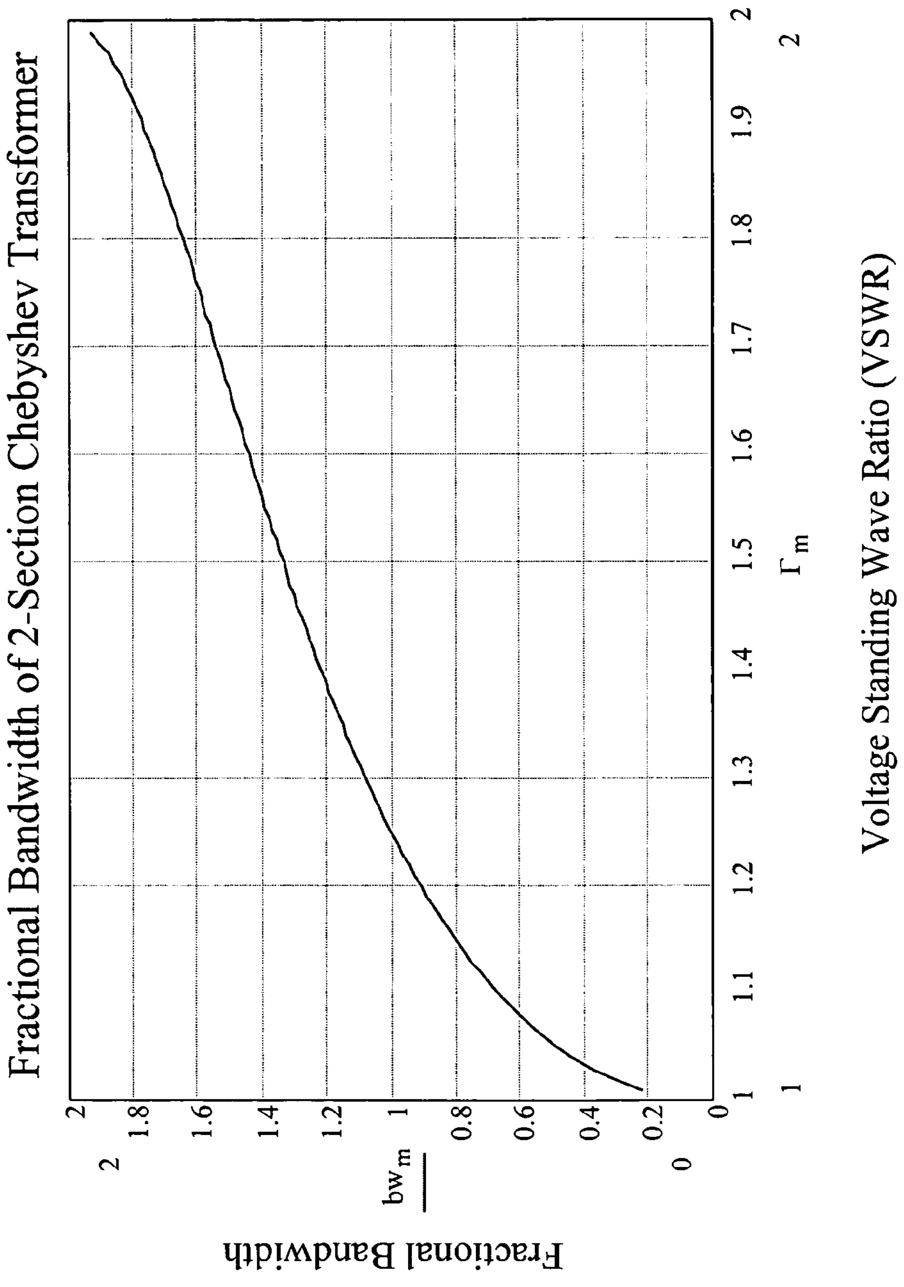
FIG. 12 provides a plot of fractional bandwidth versus VSWR for a 2-section Chebyshev transformer.

FIG. 12 provides a plot of fractional bandwidth versus VSWR for a 2-section Chebyshev transformer. FIG. 12 shows the calculated fractional bandwidth of the 2-section Chebyshev transformer with impedance ratio of 2. As shown in FIG. 12, the fractional bandwidth increases with increasing VSWR. With the same VSWR=1.22 (return loss=−20 dB), the fractional bandwidth using 2-section Chebyshev transformer is 0.951 or about 95%. That is more than double the 39% fractional bandwidth of the single-section performance shown in FIG. 9.

Figure 13:
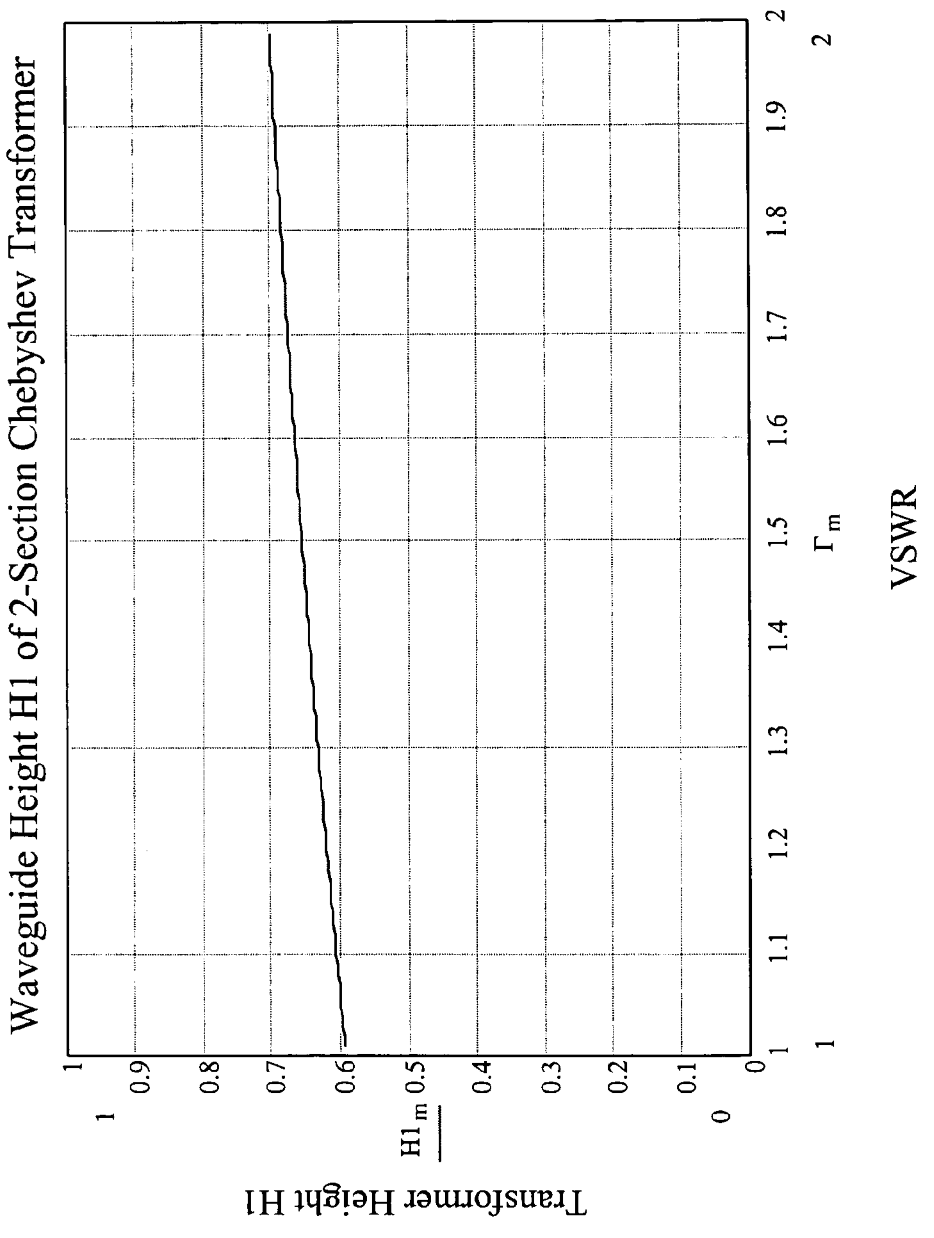
FIGS. 13 and 14 provide plots of waveguide height versus VSWR for a 2-section Chebyshev transformer.

FIG. 13 provides a plot of calculated transformer height H1 for a 2-section Chebyshev transformer as a function of VSWR. At the desired VSWR=1.22 (return loss=−20 dB), the transformer height is found to be H1=0.622*b. As the VSWR is reduced to 1.0, the transformer height H1 will approach the Butterworth transformer height of 0.595*b as shown by H1=b^(¼)*a^(¾)=b^(¼)*(b/2)^(¾)=0.595*b. Thus, H1 may be about 60% of the waveguide width.

Figure 14:
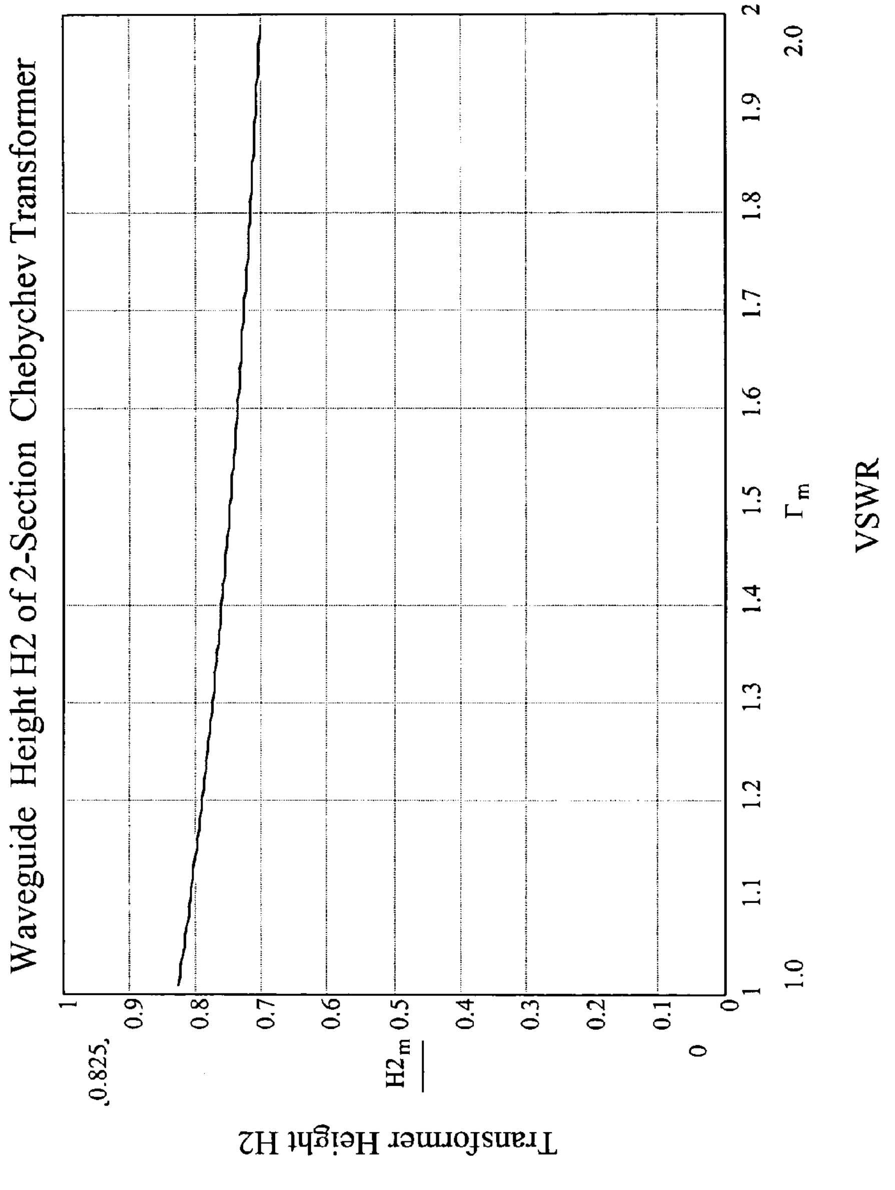

FIG. 14 provides a plot of calculated transformer height H2 for a 2-section Chebyshev transformer as a function of VSWR. At the desired VSWR=1.22, the transformer height is found to be H2=0.786*b. As the VSWR is reduced to 1.0, the transformer height H2 will increase slightly and, in the limit, will approach the Butterworth transformer height of H2=0.841*b as shown by H2=b^(¾)*a^(¼)=b^(¾)*(b/2)^(¼)=b/(2^(¼))=0.841*b. Thus, H2 may be about 80-85% of the waveguide width.

Figure 15:
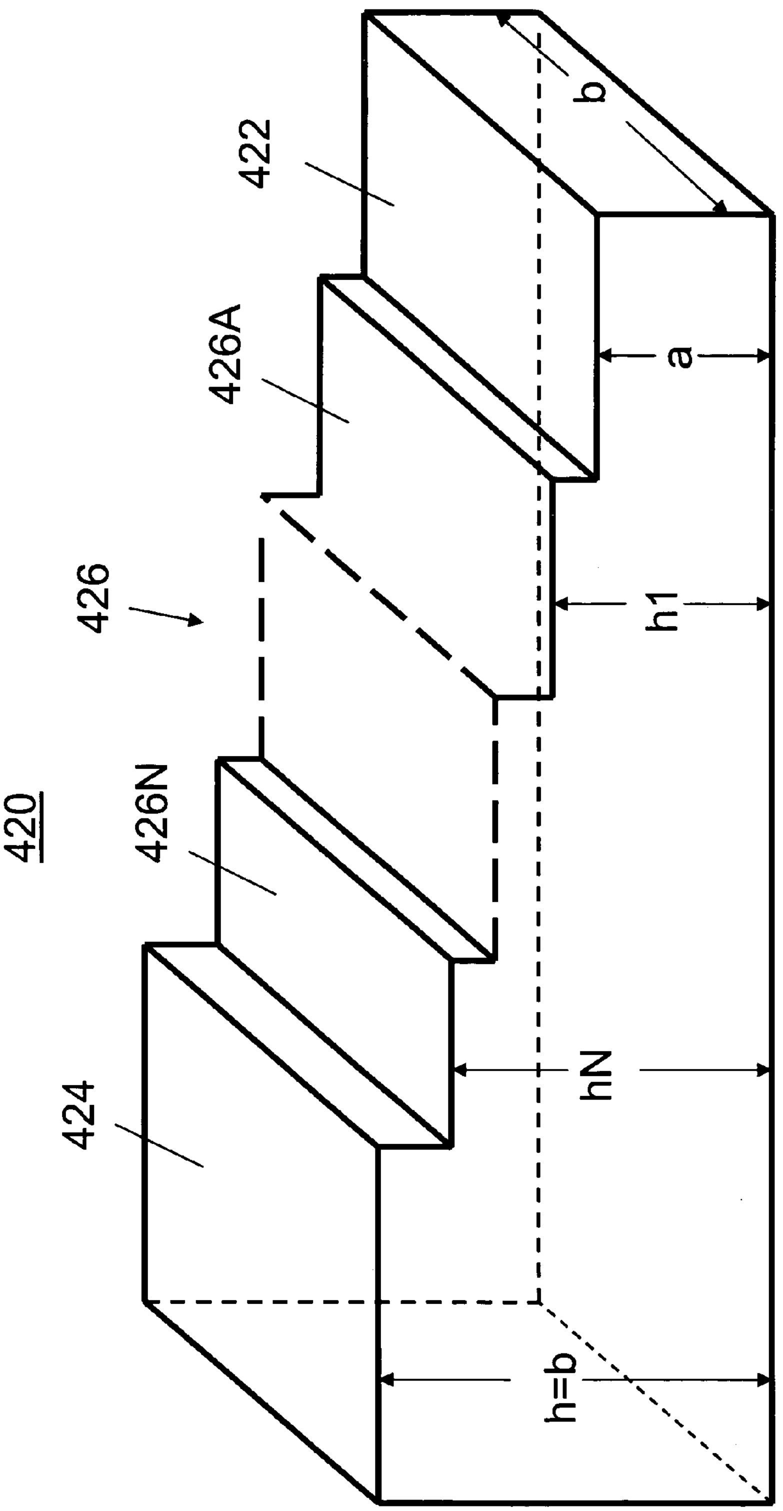
FIG. 15 depicts a waveguide channel with an N-section transformer.

FIG. 15 depicts a radial combiner waveguide channel 420 with an N-section transformer. As shown, a peripheral portion 422 of waveguide 420 may be a standard WR-34 waveguide with aspect ratio b/a≈2 (e.g., width b≈0.34 inch and height a≈b/2≈0.17"). A central portion 424 of the waveguide 410 may be a generally square waveguide, with aspect ratio b/a≈1 (e.g., a≈b≈0.34"). A transformer portion 426 of the waveguide may be disposed between the peripheral portion 422 and the central portion 424.

As shown, the transformer portion 426 may have N sections, 426A-426N, where N can be any integer. The sections 426A-426N of the transformer portion 426 may have heights h1-hN, respectively. Each section 426A-N of the transformer portion 426 may have a length of one-quarter of the guided wavelength. The heights h1-hN for a desired number of sections N may be computed by techniques that are described in the art, such as, for example, in Matthaei, Young, and Jones, *Microwave Filters, Impedance Matching Network And Coupling Structures*. For most practical applications, it is expected that two transition sections will be sufficient.

Figure 16:
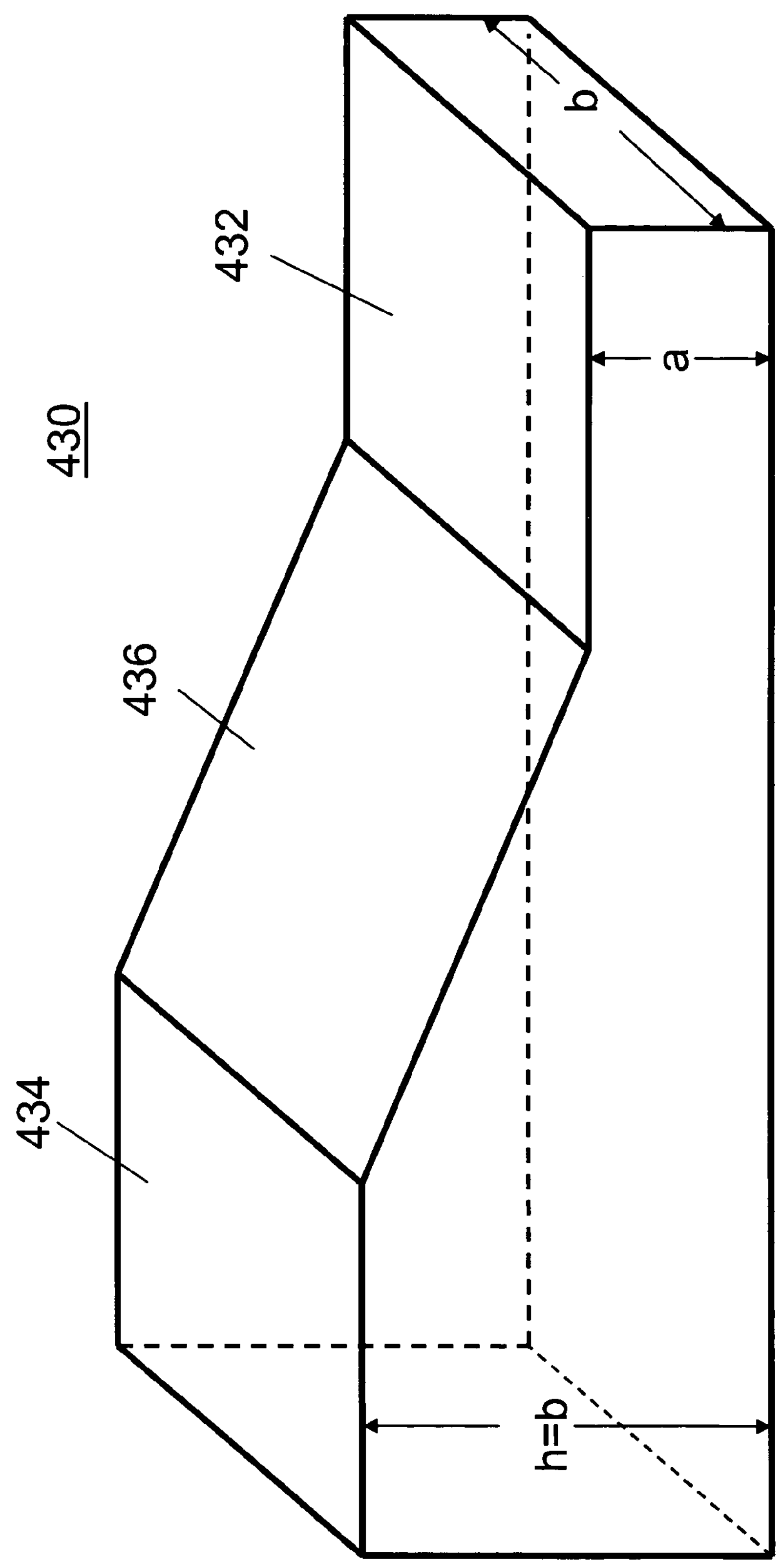
FIG. 16 depicts a waveguide channel with a linear taper transformer.

As a rule of thumb, the more sections used in the transformer, the wider the bandwidth that can be achieved. FIG. 16 depicts a radial divider/combiner waveguide channel 430 with an N-section transformer 436, in the extreme case where N=∞. Such a transformer 436 may be referred to as a "linear taper transformer." As shown, a peripheral portion 432 of the waveguide 430 may be a standard WR-34 waveguide with aspect ratio b/a≈2 (e.g., width b≈0.34 inch and height a≈b/2≈0.17"). A central portion 434 of the waveguide 430 may be a generally square waveguide, with aspect ratio b/a≈1 (e.g., a≈b≈0.34").

The transformer portion 436 may be disposed between the peripheral portion 432 and the central portion 434. The transformer portion 436 may have a height h(x) that varies linearly from h=b at x=0 (where the transformer portion 436 joins the central portion 434, to h=a at x=L (where the transformer portions 436 joins the peripheral portion 432). The transformer portion 436 may have a length of about one guided wavelength or more.

What is claimed:

1. A radial power divider/combiner comprising:

a base having a center and a periphery;

a plurality of waveguides, each of which extends along a respective direction between the center of the base and the periphery thereof;

wherein each of the waveguides is defined at least in part by a respective groove in the base; and wherein (i) at least one of the waveguides has a central portion proximate the center of the base, a peripheral portion proximate the periphery of the base, and a transformer portion disposed between the central portion and the peripheral portion, (ii) the central portion has a first transverse cross-sectional area, (iii) the peripheral portion has a second transverse cross-sectional area, and (iv) the transformer portion has a third transverse cross-sectional area that is less than the first cross-sectional area and greater than the second transverse cross-sectional area, wherein the transformer portion has a transverse cross-sectional area that varies linearly along the direction along which the waveguide extends.

2. The radial power divider/combiner of claim 1, wherein the transformer portion comprises a plurality of sections, each said section extending a respective length along the direction between the center of the base and the periphery thereof.

3. The radial power divider/combiner of claim 1, further comprising:

a first monopole antenna disposed at the center of the base.

4. The radial power divider/combiner of claim 3, further comprising:

a plurality of second monopole antennas, each said second monopole antenna disposed near a respective peripheral end of a respective one of the waveguides.

5. The radial power divider/combiner of claim 4, wherein each of said waveguides is adapted to carry signals between the first antenna and a respective one of the second antennas.

6. The radial power divider/combiner of claim 1, wherein adjacent waveguides are separated by respective wedge portions defined by the base, each said wedge portion having a pointed vertex at a respective end thereof proximate the center of the base.

7. A radial power divider/combiner comprising:

a base having a center and a periphery;

a waveguide the extends along a direction between the center of the base and the periphery thereof, wherein the waveguide is defined at least in part by a groove in the base;

wherein (i) the waveguide has a central portion proximate the center of the base, a peripheral portion proximate the periphery of the base, and a transformer portion disposed between the central portion and the peripheral portion, (ii) the central portion has a first height, (iii) the peripheral portion has a second height that is less than the first height, (iv) the transformer portion has a third height that is less than the first height and greater than the second height, and (v) the waveguide has a constant width along the central, transformer, and peripheral portions thereof;

a first monopole antenna disposed near the center of the base; and a second monopole antenna near a peripheral end of the waveguide;

wherein the waveguide is adapted to carry signals between the first antenna and the second antenna.

8. The radial power divider/combiner of claim 7, wherein the first antenna extends from the base in a first direction that is generally perpendicular to the base and the second antenna extends in the first direction from the base.

9. The radial power divider/combiner of claim 7, further comprising a cover secured to the base, wherein each of the first, second, and third heights is measured from an inner surface of the base to an inner surface of the cover.

10. The radial power divider/combiner of claim 9, wherein the first antenna extends from the base in a first direction that is generally perpendicular to the base and the second antenna extends from the cover in a second direction that is generally perpendicular to the cover.

11. The radial power divider/combiner of claim 9, wherein the base and the cover define an interior region of the divider/combiner, and wherein each of the first antenna and the second antenna extends into the interior region of the divider/combiner.

12. The radial power divider/combiner of claim 7, wherein the first, second, and third heights provide for a matched-impedance in both directions along the waveguide.

13. The radial power divider/combiner of claim 7, wherein the first height is approximately equal to the waveguide width.

14. The radial power divider/combiner of claim 7, wherein the second height is approximately half the waveguide width.

15. The radial power divider/combiner of claim 7, wherein the third height is between about 60% and 85% of the waveguide width.

16. A radial power divider/combiner comprising:

a base having a center and a periphery;

a first monopole antenna disposed near the center of the base;

a plurality of waveguides, each of which is defined at least in part by a respective groove that extends along a respective direction between the center of the first base and the periphery thereof, each said groove being adapted to carry signals between the first antenna and a respective one of the second antennas, wherein adjacent waveguides are separated by respective wedge portions defined by the base, each said wedge portion having a pointed vertex at a respective end thereof proximate the center of the base; and a plurality of second monopole antennas, each said second monopole antenna disposed near a respective peripheral end of a respective one of the waveguides;

wherein (i) at least one of the waveguides has a central portion proximate the center of the base, a peripheral portion proximate the periphery of the base, and a transformer portion disposed between the central portion and the peripheral portion, (ii) the central portion has a first transverse cross-sectional area, (iii) the peripheral portion has a second transverse cross-sectional area that is less than the first transverse cross-sectional area, and (iv) the transformer portion has a third transverse cross-sectional area that is less than the first cross-sectional area and greater than the second transverse cross-sectional area, and (v) the at least one waveguide has a constant width along the central, transformer, and peripheral portions thereof.

17. A radial power divider/combiner comprising:

a base having a center and a periphery;

a plurality of waveguides, each of which extends along a respective direction between the center of the base and the periphery thereof wherein each of the waveguides is defined at least in part by a respective groove in the base;

wherein (i) at least one of the waveguides has a central portion proximate the center of the base, a peripheral portion proximate the periphery of the base, and a transformer portion disposed between the central portion and the peripheral portion, (ii) the central portion has a first transverse cross-sectional area, (iii) the peripheral portion has a second transverse cross-sectional area, and (iv) the transformer portion has a third transverse cross-sectional area that is less than the first cross-sectional area and greater than the second transverse cross-sectional area; and a first monopole antenna disposed at the center of the base.

18. The radial power divider/combiner of claim 17, wherein the transformer portion has a fourth transverse cross-sectional area that is less than the first transverse cross-sectional area and greater than the third cross-sectional area.

19. The radial power divider/combiner of claim 17, wherein the transformer portion has a transverse cross-sectional area that varies along the direction along which the waveguide extends.

20. The radial power divider/combiner of claim 17, wherein the transformer portion comprises a plurality of sections, each said section extending a respective length along the direction between the center of the base and the periphery thereof.

21. The radial power divider/combiner of claim 17, further comprising:

a plurality of second monopole antennas, each said second monopole antenna disposed near a respective peripheral end of a respective one of the waveguides.

22. The radial power divider/combiner of claim 21, wherein each of said waveguides is adapted to carry signals between the first antenna and a respective one of the second antennas.

23. The radial power divider/combiner of claim 17, wherein adjacent waveguides are separated by respective wedge portions defined by the base, each said wedge portion having a pointed vertex at a respective end thereof proximate the center of the base.

24. A radial power divider/combiner comprising:

a base having a center and a periphery;

a plurality of waveguides, each of which extends along a respective direction between the center of the base and the periphery thereof wherein each of the waveguides is defined at least in part by a respective groove in the base; and wherein (i) at least one of the waveguides has a central portion proximate the center of the base, a peripheral portion proximate the periphery of the base, and a transformer portion disposed between the central portion and the peripheral portion, (ii) the central portion has a first transverse cross-sectional area, (iii) the peripheral portion has a second transverse cross-sectional area, and (iv) the transformer portion has a third transverse cross-sectional area that is less than the first cross-sectional area and greater than the second transverse cross-sectional area, wherein adjacent waveguides are separated by respective wedge portions defined by the base, each said wedge portion having a pointed vertex at a respective end thereof proximate the center of the base.

25. The radial power divider/combiner of claim 24, wherein the transformer portion has a fourth transverse cross-sectional area that is less than the first transverse cross-sectional area and greater than the third cross-sectional area.

26. The radial power divider/combiner of claim 24, wherein the transformer portion has a transverse cross-sectional area that varies along the direction along which the waveguide extends.

27. The radial power divider/combiner of claim 24, wherein the transformer portion comprises a plurality of sections, each said section extending a respective length along the direction between the center of the base and the periphery thereof.

28. The radial power divider/combiner of claim 24, further comprising:

a first monopole antenna disposed at the center of the base; and a plurality of second monopole antennas, each said second monopole antenna disposed near a respective peripheral end of a respective one of the waveguides.

29. The radial power divider/combiner of claim 28, wherein each of said waveguides is adapted to carry signals between the first antenna and a respective one of the second antennas.

* * * * *